(12) United States Patent
Yildiz et al.

(10) Patent No.: US 12,175,353 B2
(45) Date of Patent: Dec. 24, 2024

(54) INTERLEAVER DESIGN AND PAIRWISE CODEWORD DISTANCE DISTRIBUTION ENHANCEMENT FOR TURBO AUTOENCODER

(71) Applicant: Samsung Electronics Co., Ltd., Suwon-si (KR)

(72) Inventors: Hikmet Yildiz, Pasadena, CA (US); Homayoon Hatami, San Diego, CA (US); Jung Hyun Bae, San Diego, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 89 days.

(21) Appl. No.: 17/726,506

(22) Filed: Apr. 21, 2022

(65) Prior Publication Data

US 2022/0385307 A1    Dec. 1, 2022

Related U.S. Application Data

(60) Provisional application No. 63/303,681, filed on Jan. 27, 2022, provisional application No. 63/191,915, filed on May 21, 2021.

(51) Int. Cl.
*G06N 3/0455* (2023.01)
*G06N 3/0464* (2023.01)
(Continued)

(52) U.S. Cl.
CPC ......... *G06N 3/0455* (2023.01); *G06N 3/0464* (2023.01); *G06N 3/045* (2023.01);
(Continued)

(58) Field of Classification Search
CPC ........................... G06N 3/0455; G06N 3/0464
See application file for complete search history.

(56) References Cited

U.S. PATENT DOCUMENTS 3,652,998 A * 3/1972 Forney, Jr. ............... G06F 7/76
377/64
8,650,464 B1 * 2/2014 Tong ................. H03M 13/2721
714/779

(Continued)

OTHER PUBLICATIONS

Mark S. C. Ho, Steven S. Pietrobon and Tim Giles; Interleavers for Punctured Turbo Codes; Mobile Communications Research Center Institute for Telecommunications Research University of South Australia; Dec. 1998 (Year: 1998).*

(Continued)

*Primary Examiner* — Joseph D Torres
(74) *Attorney, Agent, or Firm* — Renaissance IP Law Group LLP

(57) ABSTRACT

A symmetric interleaver for a Convolutional Neural Network (CNN) and Recurrent Neural Network (RNN) encoder and a circular padding mode are disclosed. The interleaver interleaves elements of an input block to form an output block in which an output neighborhood of elements for each element of the output block is symmetric to an input neighborhood of elements for each element of the input block. A position of an element of the input block is interleaved based on an index i of the position times a parameter δ modulo K in which the parameter δ is relatively prime with K. A test loss function may be used to train the encoder that includes a Binary Cross Entropy (BCE) loss function plus a function that minimizes a number of codeword pairs based on a Euclidean distance. The RNN encoder may be implemented as part of a Turbo Autoencoder (TurboAE) encoder.

10 Claims, 10 Drawing Sheets

(51) Int. Cl.
  *G06N 3/045* (2023.01)
  *G06N 3/048* (2023.01)
  *G06N 3/082* (2023.01)
  *H03M 13/27* (2006.01)

(52) U.S. Cl.
  CPC ............. *G06N 3/048* (2023.01); *G06N 3/082* (2013.01); *H03M 13/2732* (2013.01); *H03M 13/275* (2013.01)

(56) References Cited

U.S. PATENT DOCUMENTS

| | | | |
|---|---|---|---|
| 10,803,378 B2 | 10/2020 | Ren et al. | |
| 10,887,009 B2 | 1/2021 | Huang et al. | |
| 2003/0219078 A1* | 11/2003 | Coffey | H04L 1/0066 375/265 |
| 2004/0064782 A1* | 4/2004 | Lerner | H03M 13/2757 714/800 |
| 2009/0110095 A1* | 4/2009 | Taylor | H04L 27/2601 375/260 |
| 2009/0125780 A1* | 5/2009 | Taylor | H04L 5/0064 714/752 |
| 2009/0221236 A1* | 9/2009 | Wang | H04L 1/0071 455/63.1 |
| 2020/0042871 A1 | 2/2020 | Francini et al. | |
| 2020/0099471 A1* | 3/2020 | Ye | H04L 1/0041 |
| 2020/0302288 A1 | 9/2020 | Ren et al. | |
| 2020/0334555 A1 | 10/2020 | Liu et al. | |
| 2020/0389188 A1* | 12/2020 | Belzer | H03M 13/2957 |
| 2021/0135733 A1* | 5/2021 | Huang | G06N 3/084 |

OTHER PUBLICATIONS

Yihan Jiang, Hyeji Kim, Himanshu Asnani, Sreeram Kannan, Sewoong Oh and Pramod Viswanath; Turbo Autoencoder: Deep learning based channel codes for point-to-point communication channels; 33rd Conference on Neural Information Processing Systems, NeurIPS 2019, Vancouver, Canada (Year: 2019).*

A. D. S. Jayalath and C. Tellambura; Use of data permutation to reduce the peak-to-average power ratio of an OFDM signal; Wireless Communications and Mobile Computing, 2002; 2:187-203 (Year: 2002).*

* cited by examiner

INTERLEAVER DESIGN AND PAIRWISE CODEWORD DISTANCE DISTRIBUTION ENHANCEMENT FOR TURBO AUTOENCODER

CROSS-REFERENCE TO RELATED APPLICATIONS

This application claims the priority benefit under 35 U.S.C. § 119(e) of U.S. Provisional Patent Application Nos. 63/303,681, filed on Jan. 27, 2022, and 63/191,915, filed on May 21, 2021, the disclosures of which are incorporated herein by reference in their entirety.

TECHNICAL FIELD

The subject matter disclosed herein relates to wireless communications. More particularly, the subject matter disclosed here relates to an interleaver and a padding mode that reduces a positional bit error rate of a CNN-based and a RNN-based encoder/decoder system, and a test loss function that may be used to train the encoder to minimize a number of codeword pairs based on a Euclidean distance.

BACKGROUND

Traditionally, channel code design has relied on human intelligence. Codes including Turbo, low-density parity-check (LDPC), and Polar have been developed by human intelligence and are utilized in current wireless standards. Such codes have been designed for additive white Gaussian noise (AWGN) channels.

SUMMARY

An example embodiment provides a symmetric interleaver for a CNN-based and a RNN-based encoder that may include an input interface, an output interface, and a controller. The input interface may be configured to receive an input block of K elements. The output interface may be configured to output an output block of K elements. The controller may be configured to interleave elements of the input block to form the output block in which an output neighborhood of elements for each element of the output block may be symmetric to an input neighborhood of elements for each element of the input block. In one embodiment, the controller may be further configured to interleave a position of an element of the input block based on an index i of the position times a parameter δ modulo K in which the parameter δ is relatively prime with K to avoid an interleaving of position i equaling an interleaving of a position j of an element of the output block for i not equaling j. In another embodiment, a value of the parameter δ is greater than or equal to a convolutional filter size w and less than or equal to a floor value of a quantity K minus w divided a quantity w minus 1. In still another embodiment, the symmetric interleaver may further include a CNN or RNN decoder. In yet another embodiment, the CNN or RNN encoder may be part of a Turbo Autoencoder (TurboAE) encoder, and the CNN or RNN decoder may be part of a TurboAE decoder. In one embodiment, the symmetric interleaver may include a circular padding mode that adds a predetermined number of elements to beginning of the input block and the predetermined number of elements to an end of the input block, interleaves the input block to form an intermediate block, and removes the predetermined number of elements from a beginning and the predetermined number of elements from an end of the intermediate block to form the output block. In another embodiment, K equals 100 elements, and a positional bit error rate (BER) of elements of the output block is less than $1 \times 10^{-3.9}$ for all bit positions of the output block. In still another embodiment, CNN encoder or RNN encoder may be part of a TurboAE encoder. In yet another embodiment, a test loss function for training the TurboAE encoder may include a Binary Cross Entropy (BCE) loss function of the TurboAE encoder plus a function that minimizes a number of codeword pairs with Euclidean distance that is at most T. In another embodiment, the function may include a Sigmoid function or a Rectified Linear Unit function.

An example embodiment provides an interleaver for a RNN encoder that may include an input interface, an output interface, and a controller. The input interface may be configured to receive an input block of K elements. The output interface may be configured to output an output block of K elements. The controller may be configured to interleave elements of the input block to form the output block in which the controller may include a circular padding mode that adds a predetermined number of elements to beginning of the input block and the predetermined number of elements to an end of the input block, interleaves the input block to form an intermediate block, and removes the predetermined number of elements from a beginning and the predetermined number of elements from an end of the intermediate block to form the output block. In one embodiment, K equals 100 elements, and a positional bit error rate (BER) of elements of the output block is less than $1 \times 10^{-3.9}$ for all bit positions of the output block. In another embodiment, the interleaver may include a symmetric interleaver in which an output neighborhood of elements for each element of the output block is symmetric to an input neighborhood of elements for each element of the input block. In still another embodiment, the controller may be further configured to interleave a position of an element of the input block based on an index i of the position times a parameter δ modulo K in which the parameter δ is relatively prime with K to avoid an interleaving of position i equaling an interleaving of a position j of an element of the output block for i not equaling j. In yet another embodiment, the interleaver may further include a RNN decoder, and the RNN encoder may be part of a TurboAE encoder, and the RNN decoder may be part of a TurboAE decoder. In one embodiment, a test loss function for the TurboAE encoder may include a Binary Cross Entropy loss function of the TurboAE encoder plus a function that minimizes a number of codeword pairs with Euclidean distance that is at most T. In yet another embodiment, the function may include a Sigmoid function or a Rectified Linear Unit function.

An example embodiment provides an encoder that may include an input interface, an output interface and a controller. The input interface may be configured to receive an input block of K elements. The output interface may be configured to output an output block of K elements. The controller may be configured to encode elements of the input block to form an encoded block of elements, and a test loss function for a channel code for training the encoder may include a Binary Cross Entropy loss function plus a function that minimizes a number of codeword pairs with Euclidean distance that is at most T. In one embodiment, the encoder may include a RNN encoder in which the RNN encoder may be part of a TurboAE encoder, and in which the function may include a Sigmoid function or a Rectified Linear Unit function. In another embodiment, the encoder may further include a symmetric interleaver configured to interleave the input block to form an interleaved block in which a neighborhood of elements for each element of the interleaved block is symmetric to an input neighborhood of elements for each element of the input block, and the symmetric interleaver may include a circular padding mode that adds a predetermined number of elements to beginning of the input block and the predetermined number of elements to an end of the input block, interleaves the input block to form an intermediate block, and removes the predetermined number of elements from a beginning and the predetermined number of elements from an end of the intermediate block to form the output block.

BRIEF DESCRIPTION OF THE DRAWING

In the following section, the aspects of the subject matter disclosed herein will be described with reference to exemplary embodiments illustrated in the figure, in which.

DETAILED DESCRIPTION

Figure 1A:
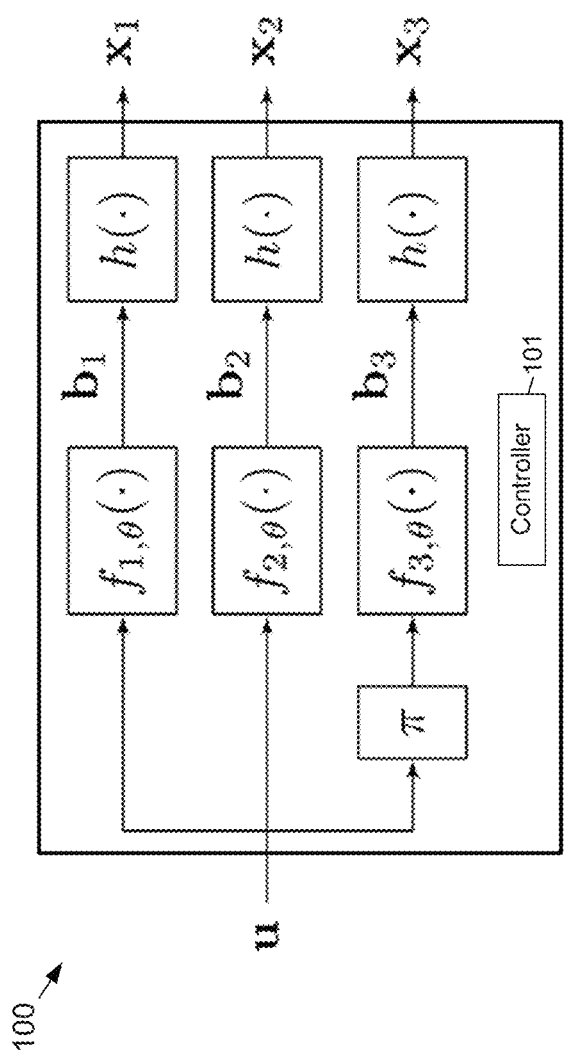
FIGS. 1A and 1B respectively depict functional block diagrams of a TurboAE encoder and a decoder.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

Error correction coding using state-of-art deep-learning technology has become an research topic in wireless communication and may be adopted in future wireless technology, such as 6G cellular communication. There may be two potential issues with codes designed by human intelligence that artificial intelligence may possibly address. First, most practical channels are not AWGN. Artificial intelligence may be able to modify a decoder to work well under other channel models. Second, these codes are also known to be near-optimal for a finite block length, although optimal performance is not guaranteed. Deep learning may be used for end-to-end design of an encoder and a decoder, and deep learning may also be used for designing decoders for the current near-optimum codes.

It has been shown that for Turbo codes a recurrent neural network (RNN) and a convolutional neural network (CNN) may be used for decoder design. It has also been shown that not only the decoder, but the entire end-to-end system may be designed using a CNN to mimic the structure of a Turbo encoder and decoder. There may be some issues with using data-driven learning based methods for designing encoder and decoder units for channel coding. That is, good codes may be designed only for short to moderate block length codes.

The subject matter disclosed herein relates to interleaver design, and performance of an encoder based on the interleaver design. In one embodiment, the encoder may be the Turbo Autoencoder (TurboAE), which is an end-to-end jointly trained neural channel encoder and decoder. The interleaver design and a padding mode disclosed herein provides a performance improvement for TurboAE. In one embodiment, a symmetric interleaver design and a circular padding mode flattens and improves positional bit error rate (BER) of a TurboAE CNN. Additionally, TurboAE with recurrent neural network (RNN) units may be successfully trained as disclosed herein. That is, a technique is disclosed that flattens the positional BER curve of TurboAE RNN, which also thereby enhances the overall performance of TurboAE RNN.

TurboAE is an end-to-end jointly trained neural encoder and decoder that approaches a state-of-the-art performance for AWGN channels for moderate block lengths, e.g., block lengths of 100 elements. TurboAE also outperforms the state-of-the-art codes under non-AWGN settings in terms of reliability. Several interleavers have been proposed and investigated for classical Turbo codes. Similar to classical Turbo codes, the TurboAE structure includes an interleaver and a de-interleaver. It has been shown that linear interleavers may provide performance gains over the random interleavers that have been previously used.

The original paper introducing TurboAE does not include a successful RNN TurboAE training, and the best results that are disclosed are based on a TurboAE CNN. RNN may be used because a CNN TurboAE may be limited to a window size, but RNN may not be limited to such a window. As disclosed herein, some types of padding may be used for a RNN to flatten the end points of positional BER.

Figure 1B:
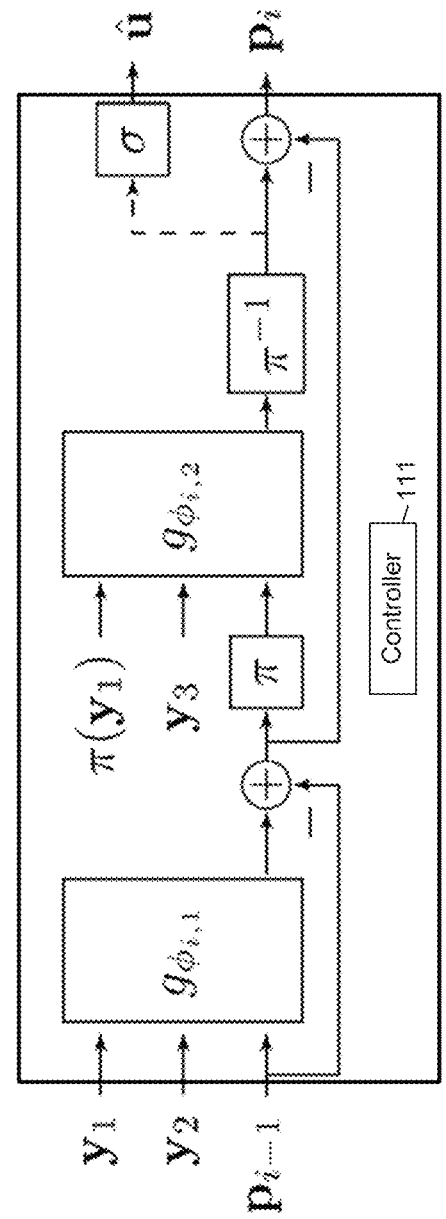

FIGS. 1A and 1B respectively depict functional block diagrams of a TurboAE encoder 100 and a decoder 110. The encoder 100 is an encoder for rate ⅓ and includes learnable neural encoding blocks $f_{1,\theta}$, $f_{2,\theta}$, and $f_{3,\theta}$ and corresponding neural blocks h. Each neural block f includes one layer of a two-dimensional CNN with 100 filters of kernel size 5. The h neural blocks are power normalization blocks. In some embodiments, a controller 101 may be used to control operation of the encoder 100. The various functional blocks of the encoder 100 may be implemented by one or more discrete components, hybrid components and/or modules. The decoder 110 includes neural blocks $g_{\varphi_{i,1}}$ and $g_{\varphi_{i,2}}$. Each layer of a neural block g includes five layers of a one-dimensional CNN with 100 filters of kernel size 5, similar to the encoder 100. In some embodiments, a controller 111 may be used to control operation of the decoder 110. The various functional blocks of the decoder 110 may be implemented by one or more discrete components, hybrid components and/or modules. The blocks $f_{i,\theta}$ and $g_{\varphi_{i,j}}$ are CNN for TurboAE CNN, or RNN for TurboAE RNN. Both neural network embodiments accept a variable input length K.

The encoder 100 receives as an input a binary message (vector) u as a block, or sequence, of elements (i.e., bits) of size K. The binary input vector $u \in \{0,1\}^K$ is first encoded into the real vectors $b_1 = f_{1,\theta}(u)$, $b_2 = f_{2,\theta}(u)$, $b_3 = f_{3,\theta}(\pi(u))$ in which π is an interleaving function. Subsequently, a power constraint h(·) is applied to obtain a codeword $c = (x_1, x_2, x_3)$ in which $x_1=h(b_i)$. In TurboAE continuous, $x_i$ is a real vector with an average power of 1 and in TurboAE binary, the entries of $x_i$ are ±1. The codeword c is transmitted over a channel (not shown). At the decoder 110, a noisy version of the code word c is received, which is represented by y and is separated into $y_1$, $y_2$, $y_3$. The neural blocks $g_{\varphi_{i,1}}$ and $g_{\varphi_{i,2}}$ generate û as an estimate of u. FIG. 1B depicts the i-th iteration of a TurboAE decoder in which the output û is computed only in the last iteration by applying a sigmoid function σ.

An interleaver choice for TurboAE may be arbitrary, which means that an interleaver may be randomly selected at the beginning of training, and is fixed throughout training and testing. It may be shown that different arbitrary interleavers for TurboAE CNN have a similar bit-error-rate (BER) performance.

Figure 1C:
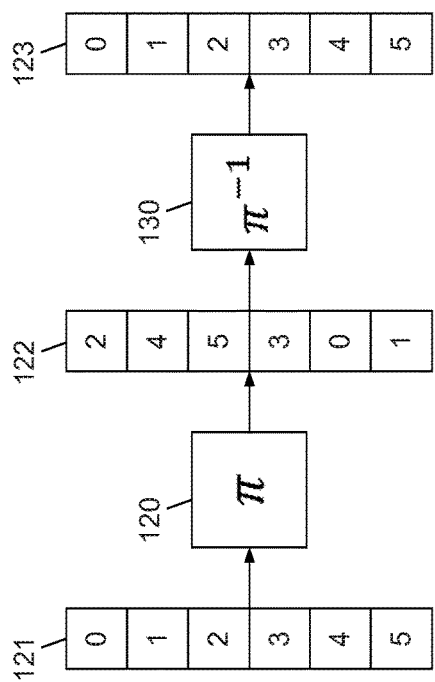
FIG. 1C provides a functional depiction of an interleaver and a de-interleaver for an example input size.

FIG. 1C provides a functional depiction of an interleaver 120 and a de-interleaver 130 for an example input size K=6. The interleaver 120 permutes a sequence of K symbols 121 by a one-to-one function π(i). The functionality of the interleaver 120 may be completely defined by π(i), i.e., an input element at position i of the interleaver 120 may be mapped to position π(i) of the interleaver output to form an interleaved block 122. The de-interleaver 130 provides an inverse functionality to the interleaving functionality of the interleaver 120 to form a block 123 having the same element positioning as the input sequence 121.

In some embodiments, a controller 124 may be used to control operation of the interleaver 120. Alternatively, the controller 101 used for controlling the encoder 100 may be used to control operation of the interleaver 120. The de-interleaver similarly may include a controller (not shown) to control operation of the de-interleaver 130. Alternatively, the controller 111 used for controlling the decoder 110 may be used to control operation of the de-interleaver 130. The various functional blocks of the interleaver 120 and the de-interleaver 130 may be implemented by one or more discrete components, hybrid components and/or modules.

Figure 1D:
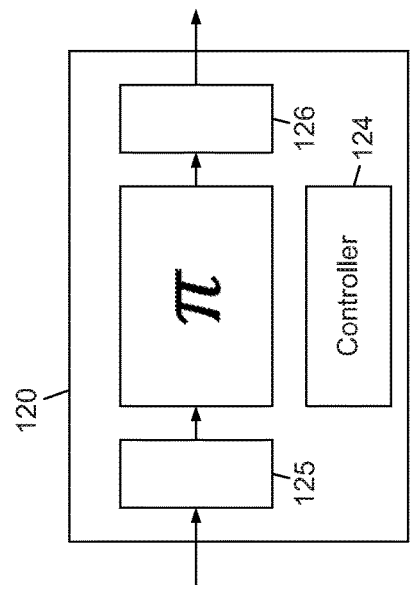
FIG. 1D depicts additional details of an example embodiment of the interleaver according to the subject matter disclosed herein.

FIG. 1D depicts additional details of an example embodiment of the interleaver 120 according to the subject matter disclosed herein. The interleaver 120 may include an input interface 125 that receives an input block, or sequence, of K elements. The interleaving function π is applied to the received input block, and the interleaved block is then output to an output interface 126. Although not shown, the de-interleaver 130 may include components that are configured to be a functional inverse of the interleaver 120.

One way to classify interleavers may be to put the interleavers in two groups of random-based and algebraic interleavers. Random interleavers may be defined by a random permutation of K elements with no repetitions. Interleaved addresses may be obtained using random-based techniques. The data sequence may be written to and read from the interleaver in a specific random order. It should be noted that the same random interleaver may be used over all sequences. It has been shown that different randomly designed interleavers perform quite similarly.

A linear interleaver may be a maximum spread interleaver. Interleaved addresses may be obtained by an algebraic expression. The entire interleaver mapping is stored for random-based interleavers, which is unlike algebraic interleavers. For implementation purposes, algebraic interleavers may be more generally appropriate. Some of the most popular interleavers used for Turbo codes may be random, S-random, linear, quadratic permutation polynomials (QPP) and dithered relative prime (DRP).

Traditionally, two interleaver metrics have been found to be important for Turbo codes: Spread factor and randomness. These two metrics may be used as a baseline for designing multiple interleavers for Turbo Codes. The spread factor metric is associated with two symbols at positions i and j, and may be defined as $$s(i,j)=|i-j|_N+|\pi(i)-\pi(j)|_N, \quad (1)$$

in which $$|i-j|_N=\min[(i-j)(\bmod N),(j-1)(\bmod N)] \quad (2)$$

is the Lee distance.

The minimum value of the spread factor is $$S_{min} = \min_{i,j} S(i, j). \quad (3)$$

For Turbo codes with a tail-biting termination, the upper bound for $S_{min}$ may be shown to be $\sqrt{2N}$. A maximum-spread-factor interleaver may be an interleaver achieving a spread factor upper bound of $\sqrt{2N}$.

To have a similar length input and an output in a CNN layer, the input sequence is usually padded. For an input length K filter size w, a padding $$P = \frac{(w-1)}{2}$$

may be added to both the beginning and the end of the input sequence assuming w is odd. Zero padding is when 0s are used for padding. Alternatively, circular padding may be used in which the last P entries at the end of the input sequence is padded to the beginning, and the first P entries of the input are padded to the end of the sequence. It has been shown that circular padding provides more symmetry to the end-to-end system, and may help flatten a positional BER of decoded bits. Otherwise, with zero padding, higher BER occurs at the beginning and at the end positions of decoded bits, as well as certain positions in the middle depending on the interleaver. Herein, circular padding is used for CNN layers.

Figure 2:
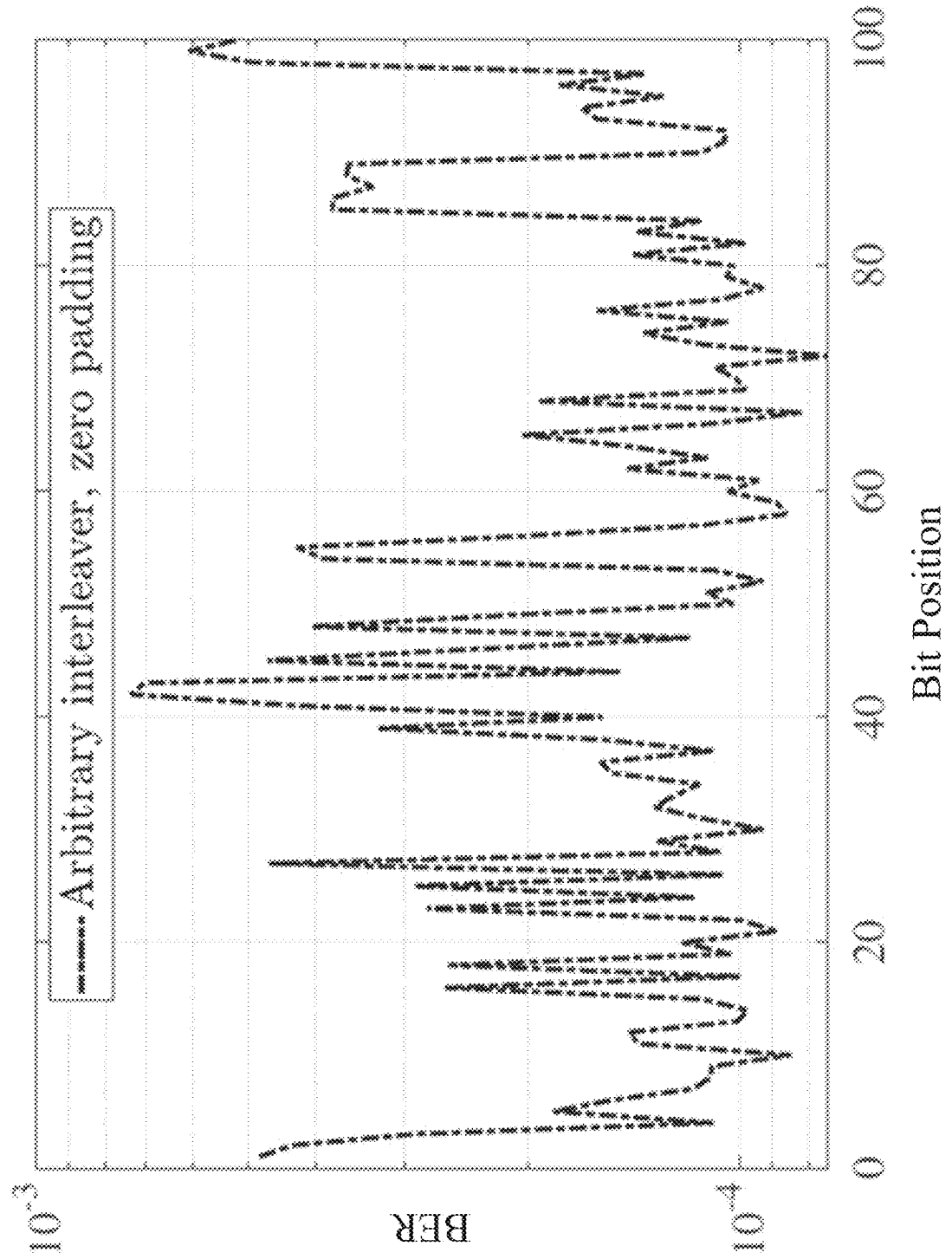
FIG. 2 is a graph of positional bit error rate of decoded bits for a block size K=100 for TurboAE using an arbitrary interleaver and zero padding.

In the original TurboAE paper, an arbitrary interleaver and zero padding were used. FIG. 2 is a graph of positional BER of decoded bits for a block size K=100 for TurboAE using an arbitrary interleaver and zero padding. The abscissa of FIG. 2 is bit position of a decoded bit and the ordinate of FIG. 2 is BER of the decoded bit. Notably, the curve shown in FIG. 2 is not flat, which means that some bit positions have a higher BER than other bit positions. For example, bit position 42 has a very high BER as compared to bit position 30. The BER variation across bit positions results in a much higher BER for TurboAE using an arbitrary interleaver and zero padding. It should also be noted that the original TurboAE paper does not use any techniques to further enhance a pairwise codeword distance distribution, and does not use any regularizer for a loss function. And, although the original TurboAE paper mentions a RNN structure for TurboAE, no disclosure is provided relating to a padding technique for a RNN structure.

The subject matter discloses herein improves BER performance for TurboAE by using a symmetric interleaver for interleaver 120, and uses circular padding to flatten the positional BER curve. Although the focus in the following description is on a symmetric interleaver, it should be understood that an encoder/decoder system according to the subject matter disclosed herein that uses an interleaver includes a corresponding symmetric de-interleaver. In one embodiment, when a symmetric interleaver is used, the new neighborhood for each entry (element) of an example block of length K=100 (i.e., the input size) after interleaving is symmetric according to the following equation.

$$(\pi(i)-\pi(i+k)) \bmod K = (\pi(i)-(i+j)) \bmod K \quad (4)$$

for every i, j and k.

In one embodiment, the symmetric interleaver 120 interleaves bit positions symmetrically as $$\pi(i) = i\delta \bmod K, i=0,1,\ldots,K-1, \quad (5)$$

in which $\delta$ is a fixed parameter that is relatively prime with K in order to avoid $\pi(i)=\pi(j)$ for $i \neq j$. As used therein, the term "relatively prime" means that $\delta$ and K have no common factors except 1.

Eq. (5) satisfies certain shift-invariant conditions that lead to the BER curve for each bit position to be flattened when circular padding is used for all CNN units in the encoder and the decoder of TurboAE. Regarding the shift-invariant conditions, for a permutation $\pi$ of numbers $1, \ldots, n$, and an m×n matrix $X=[x_1\ x_2\ \ldots\ x_n]$, $\pi(X)$ may be written as $\pi(X)=[x_{\pi(1)}\ x_{\pi(2)}\ \ldots\ x_{\pi(n)}]$. Let s be the left circular shift, which is a permutation satisfying $$s([x_1 x_2 \ldots x_n]) = [x_2 x_3 \ldots x_n x_1] \quad (6)$$

Denote i consecutive application of s by $s^i$. A function a: $\mathbb{R}^{m_1 \times n} \rightarrow \mathbb{R}^{m_2 \times n}$ is called shift-invariant if $a \circ s = s \circ a$, i.e. $a(s(X))=s(a(X))$ for all $X \in \mathbb{R}^{m_1 \times n}$. A CNN layer with circular padding is shift-invariant. Eq. (5) allows the whole end-to-end TurboAE to be shift-invariant.

To also ensure that the positional BER curve has low values, the following equations should be satisfied.

$$D_1 = D_2 = \{\pm i \bmod K | 1 \leq i \leq w-1\}, \quad (7)$$

$$D_3 = \{\pm i\delta \bmod K | 1 \leq i \leq w-1\}, \text{ and} \quad (8)$$

$$D_1 \cap D_3 = \emptyset. \quad (9)$$

In view of the conditions of Eqs. (7)-(9), desirable values of $\delta$ are as follows:

$$w \leq \delta \leq \left\lfloor \frac{K-w}{w-1} \right\rfloor. \quad (10)$$

To enhance the symmetry in the positional BER curve for any RNN based encoder, decoder, or encoder\decoder system, a similar circular padding may be used. In one embodiment, P' elements may be added to the beginning and P' elements may be added to the end of an input sequence of size K that enters a RNN unit. The output sequence from the RNN unit is of size P'+K+P'. The additional 2P' elements of the output sequence and then dropped. That is, the P' elements are dropped from the beginning and from the end of the output sequence. It should be noted that the circular padding described herein, if used with a symmetric interleaver, is not limited to TurboAE and enhances the symmetry of the positional BER for any RNN unit.

Figure 3:
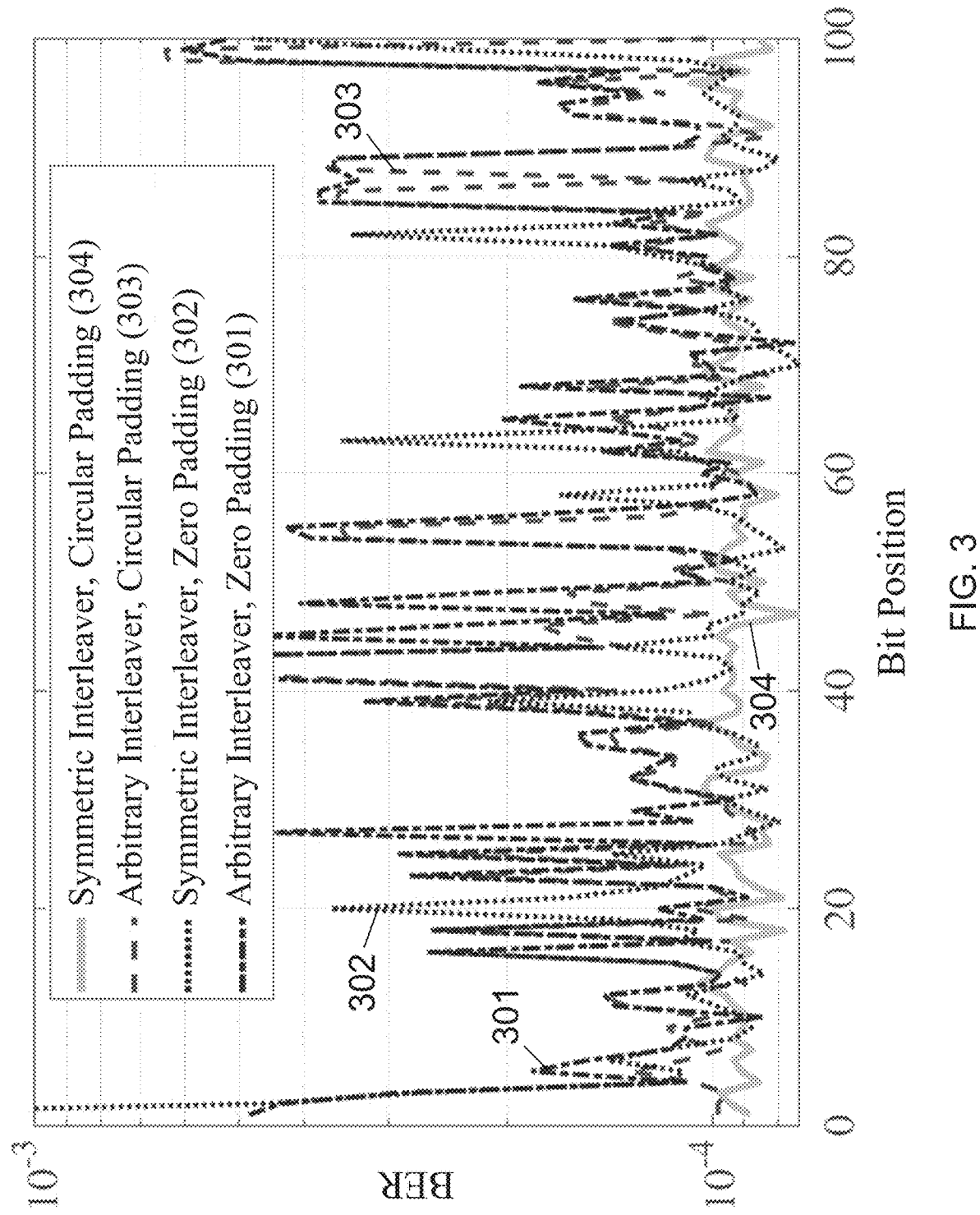
FIG. 3 is a graph showing positional bit error rate curves for four different combinations of symmetric and arbitrary interleavers with circular and zero padding for TurboAE CNN of size K=100.

FIG. 3 is a graph showing positional BER curves for TurboAE CNN for four different combinations of symmetric and arbitrary interleavers with circular and zero padding for size K=100. Curve 301 shows positional BER for an arbitrary interleaver with zero padding. Curve 301 represents the positional BER curve for TurboAE described in the original paper, and is also shown in FIG. 2.

Curve 302 shows positional BER for a symmetric interleaver with zero padding. Curve 302 generally shows improvements over curve 301, but not in all positions of TurboAE CNN.

Curve 303 shows positional BER for an arbitrary interleaver with circular padding. Curve 303 also generally shows improvements over curve 301, but again not in all positions of TurboAE CNN.

Curve 304 shows positional BER for a symmetric interleaver with circular padding. Curve 304 shows marked improvement over each of curves 301-303. Use of a symmetric interleaver with circular padding also shows a significant flattening of the positional BER for all positions of TurboAE CNN.

A third aspect disclosed herein enhances the pairwise codeword distance distribution and is also not limited to TurboAE, but may be used for any channel code design (including TurboAE). Accordingly, to minimize the number of codeword pairs with Euclidean distance of at most T, the following equation is used.

$$F(T) = \frac{1}{\binom{2^K}{2}} \sum_{1 \leq i,j \leq 2^K, i \neq j} 1(d(c_i, c_j) \leq T). \quad (11)$$

To achieve minimization of the number of codeword pairs, F(T) may be added to the Binary Cross Entropy (BCE) loss function of TurboAE. When K=100, there are a large number of codeword pairs, so only the pairs generated for K=10 are used for F(T). The derivative of the indicator function used in F(T) is zero almost everywhere, so the indicator function may be approximated by a differentiable function, such as a Sigmoid function or a Rectified Linear Unit (ReLu) function. An indicator function that may be used in F(T) may be defined as follows:

$$1(x) = \begin{cases} 1 & \text{if } x \geq 0 \\ 0 & \text{if } x < 0 \end{cases}. \quad (12)$$

Accordingly, three following example loss functions may be added to the BCE loss function for TurboAE.

$$\text{Loss}_1 = \text{BCE} + \lambda \Sigma_{1 \leq i,j \leq 2^K, i \neq j} \sigma((T-d(c_i,c_j))C), \quad (13)$$

$$\text{Loss}_e = \text{BCE} + \lambda \Sigma_{1 \leq i,j \leq 2^K, i \neq j}(T-d(c_i,c_j))_+, (x)_+ = \max\{0,x\},$$
and $\quad (14)$ $$\text{Loss}_3 = \text{BCE} + \lambda \Sigma_{1 \leq i,j \leq 2^K, i \neq j}(T-d(c_i,c_j))_+ + \lambda \Sigma_{1 \leq i,j \leq 2^K, i \neq j}(T_1-d(c_i^{(1)},c_j^{(1)}))_+ + \lambda \Sigma_{1 \leq i,j \leq 2^K, i \neq j}(T_2-d(c_i^{(2)},c_j^{(2)}))_+ \quad (15)$$

in which $c^{(1)}=(x_1,x_2)$ and $c^{(2)}=(x_1,x_3)$ for $c=(x_1,x_2,x_3)$.

Training of TurboAE RNN may be significantly enhanced by applying a proper learning rate. Additionally, reducing the learning rate after a certain number of training epochs may be another aspect of training TurboAE RNN. Based on a learning rate of $lr=10^{-4}$, the test loss for TurboAE RNN does not decrease sufficiently fast compared to the TurboAE CNN case. Therefore, by reducing the learning rate to values of $lr=5\times10^{-3}$ and $lr=10^{-3}$, the training loss was able to be decreased to levels close to the test loss of TurboAE CNN. Thus, by only modifying the learning rate, BER vs. SNR of TurboAE RNN continuous became comparable to that of a TurboAE CNN. This is referred to herein as a trained model $R_1$. The performance of TurboAE CNN has been further enhanced. In the following, efforts to further enhance performance of TurboAE RNN are described.

For TurboAE CNN, perfect symmetry may be achieved by using circular padding and a symmetric interleaver as described herein. For TurboAE RNN, however, if a symmetric interleaver or even no interleaver is selected, achieving symmetry may not be as simple as for TurboAE CNN. For an input sequence of length K to the RNN, elements at the beginning of the sequence do not have any other prior elements. Similarly, the elements at the end of the sequence do not have any other subsequent elements. This is different for the elements in the middle of the sequence. Consequently, the outputs at the both ends of the sequence may be calculated differently from the output in the middle of the sequence. This issue may be completely addressed for a first layer of a CNN by using circular padding. As such, such an approach may be used to bring symmetry to the RNN units of TurboAE. If symmetry is desired for any RNN structure, such as other channel-coding techniques based on RNN units, this method may be applied to such an RNN structure.

Theoretically, each output position may be correlated to all the elements of the input sequence. Therefore, to bring symmetry to the end points of the RNN units, the sequence length may be allowed to be extended to infinity. This may not be possible for a finite-length TurboAE. In practice, however, as the distance between the positions of the sequence increases, the previously mentioned correlation decreases. If an assumption is made that the inter-dependency between neurons only exists when the distance between their position is up to w', then it may be enough to circularly pad $$P' = \frac{(w'-1)}{2}$$

elements to both the beginning and the end of the input sequence assuming w' is odd. In a way, it may be an assumption that the inter-dependency exists only in a window of size w'. Based on this assumption, similar to the case for TurboAE CNN, a circular padding may be manually created for the sequence with size P'. In this case, the output sequence of the RNN unit may be of size P'+K+P', therefore, the additional 2P' elements of the sequence should be discarded after each RNN unit.

If no interleaver is used, an asymmetry from an interleaver is eliminated, and the impact of the proposed padding may be determined. Therefore, performance of model $R_1$ was tested by removing the interleaver and the de-interleaver of TurboAE RNN. The testing was compared for no padding vs. the proposed padding with P'=20. It should be noted that the end points having no padding have a higher positional BER, while the circular padding disclosed herein addresses this issue. Another important observation may be that the overall positional BER is fairly flat, but not perfectly flat.

A symmetric interleaver was also selected and the performance of model $R_1$ was tested with the selected interleaver with and without the proposed padding. The results are similar in the sense that the positional BER with a symmetric interleaver may be flattened at the end points by the proposed circular padding.

Figure 4:
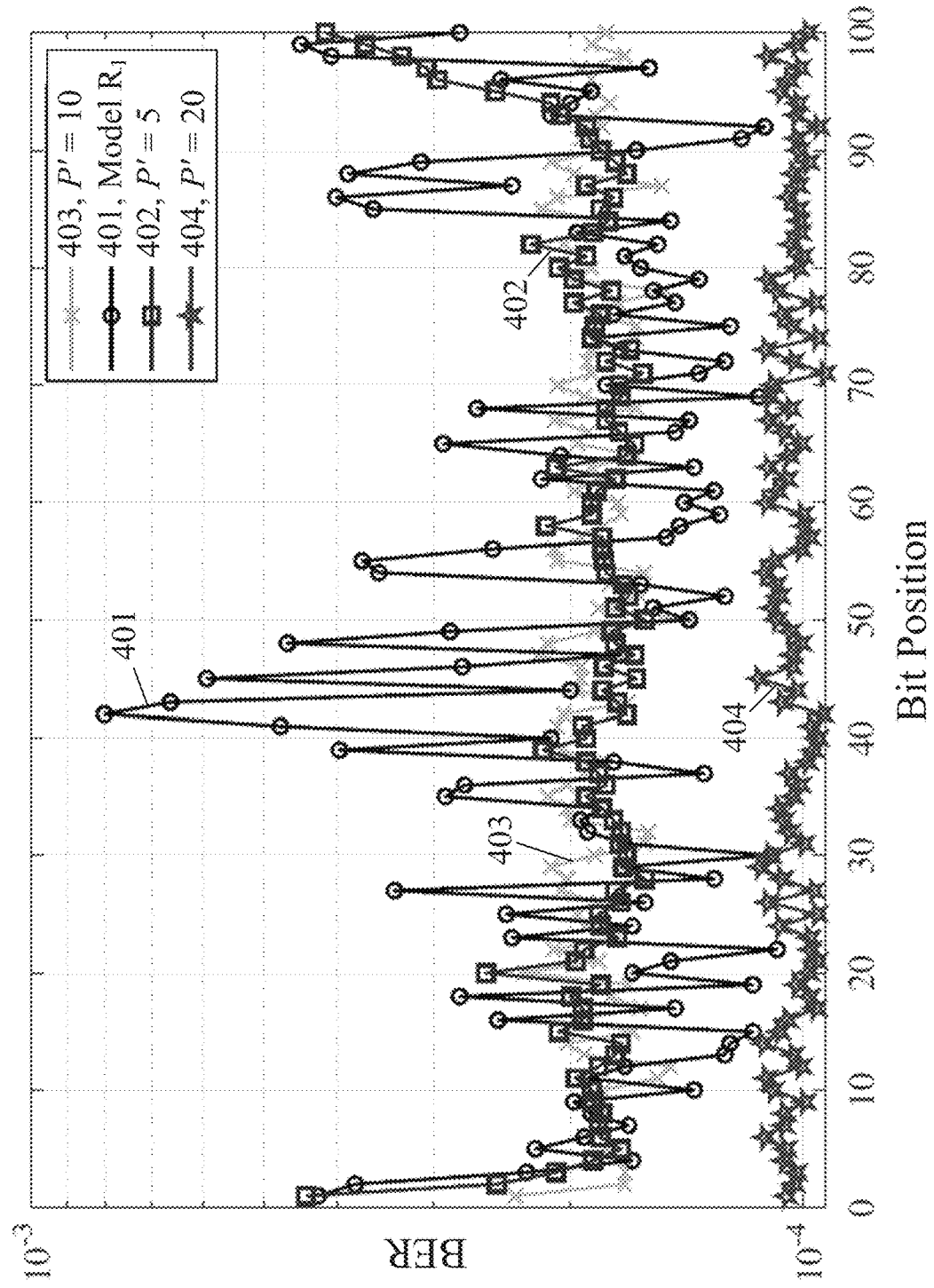
FIG. 4 is a graph showing positional bit error rate curves for a symmetric interleaver with circular padding having different values of P' for TurboAE RNN.

FIG. 4 is a graph showing positional BER curves for a symmetric interleaver with circular padding having different values of P' for TurboAE RNN. Curve 401 is the positional BER for model $R_1$ the original TurboAE RNN using a symmetric interleaver with P'=0, that is, with no padding. Curve 401 is similar to the curve shown in FIG. 2. Curve 402 is the positional BER for TurboAE RNN using a symmetric interleaver with P'=5. Curve 403 is the positional BER for TurboAE RNN using a symmetric interleaver with P'=10. Curve 404 is the positional BER for TurboAE RNN using a symmetric interleaver with P'=20. As shown in FIG. 4, using a symmetric interleaver with circular padding in which P' relatively small still provides an improvement in positional BER over the original TurboAE RNN using a symmetric interleaver with no padding. As P' increases, the flatness and magnitude of the positional BER significantly improves.

Figure 5:
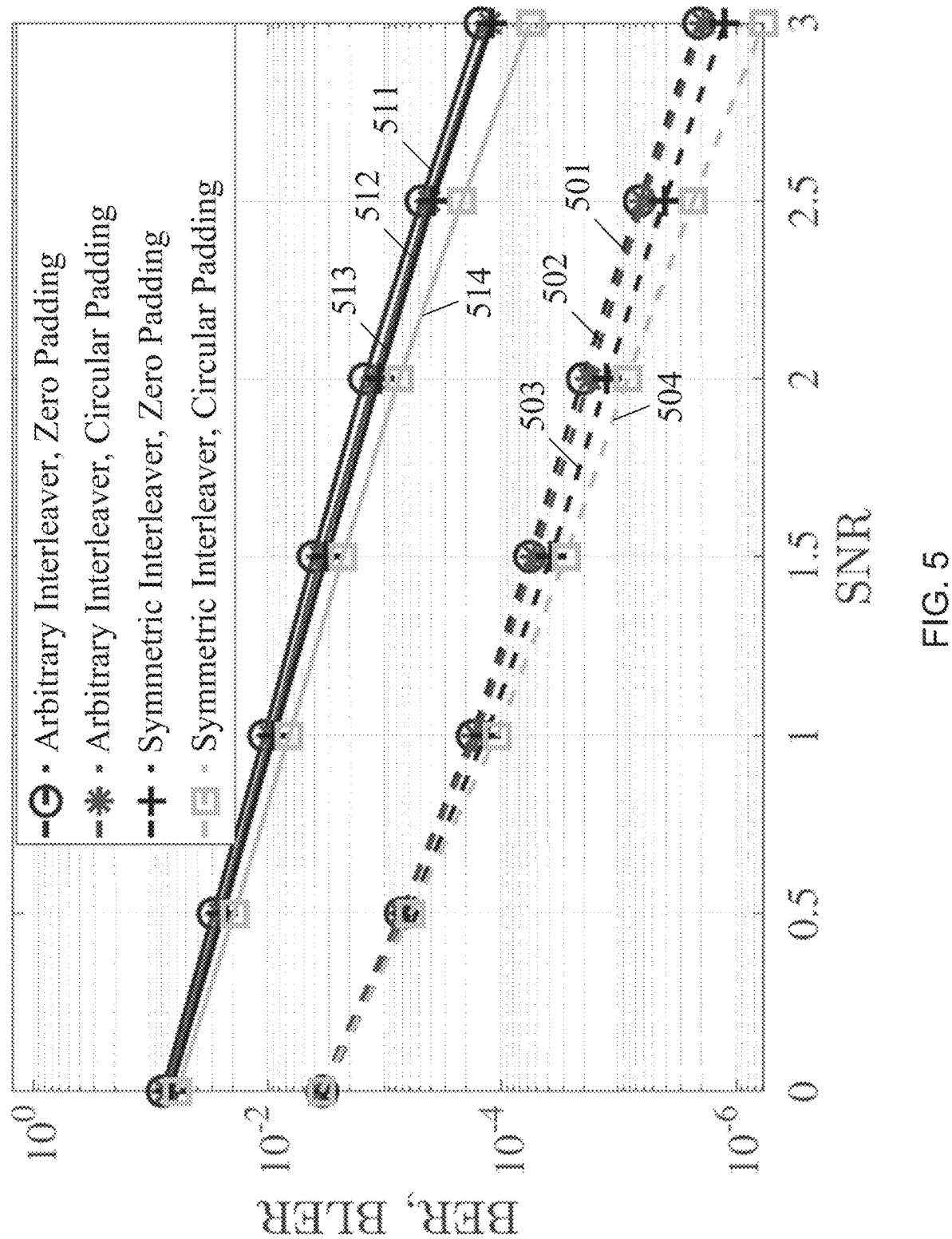
FIG. 5 is a graph showing positional bit error rate and block error rate performance as a function of signal-to-noise ratio for four different combinations of symmetric and arbitrary interleavers using circular or zero padding for TurboAE CNN of size K=100.

FIG. 5 is a graph showing positional BER and Block Error Rate (BLER) performance of TurboAE CNN as a function of Signal-to-Noise Ratio (SNR) for four different combinations of symmetric and arbitrary interleavers using circular or zero padding for size K=100. The curves of FIG. 5 show that using a symmetric interleaver and circular padding improves BER performance for TurboAE. Curve 501 is BER performance for TurboAE using an arbitrary interleaver with zero padding. Curve 502 is BER performance for TurboAE using an arbitrary interleaver with circular padding. Curve 503 is BER performance with TurboAE using a symmetric interleaver with zero padding. Curve 504 is BER performance with TurboAE CNN using a symmetric interleaver with circular padding.

Curve 511 is BLER performance for TurboAE CNN using an arbitrary interleaver with zero padding. Curve 512 is BLER performance for TurboAE using an arbitrary interleaver with circular padding. Curve 513 is BLER performance with TurboAE using a symmetric interleaver with zero padding. Curve 514 is BLER performance with TurboAE using a symmetric interleaver with circular padding.

Figure 6:
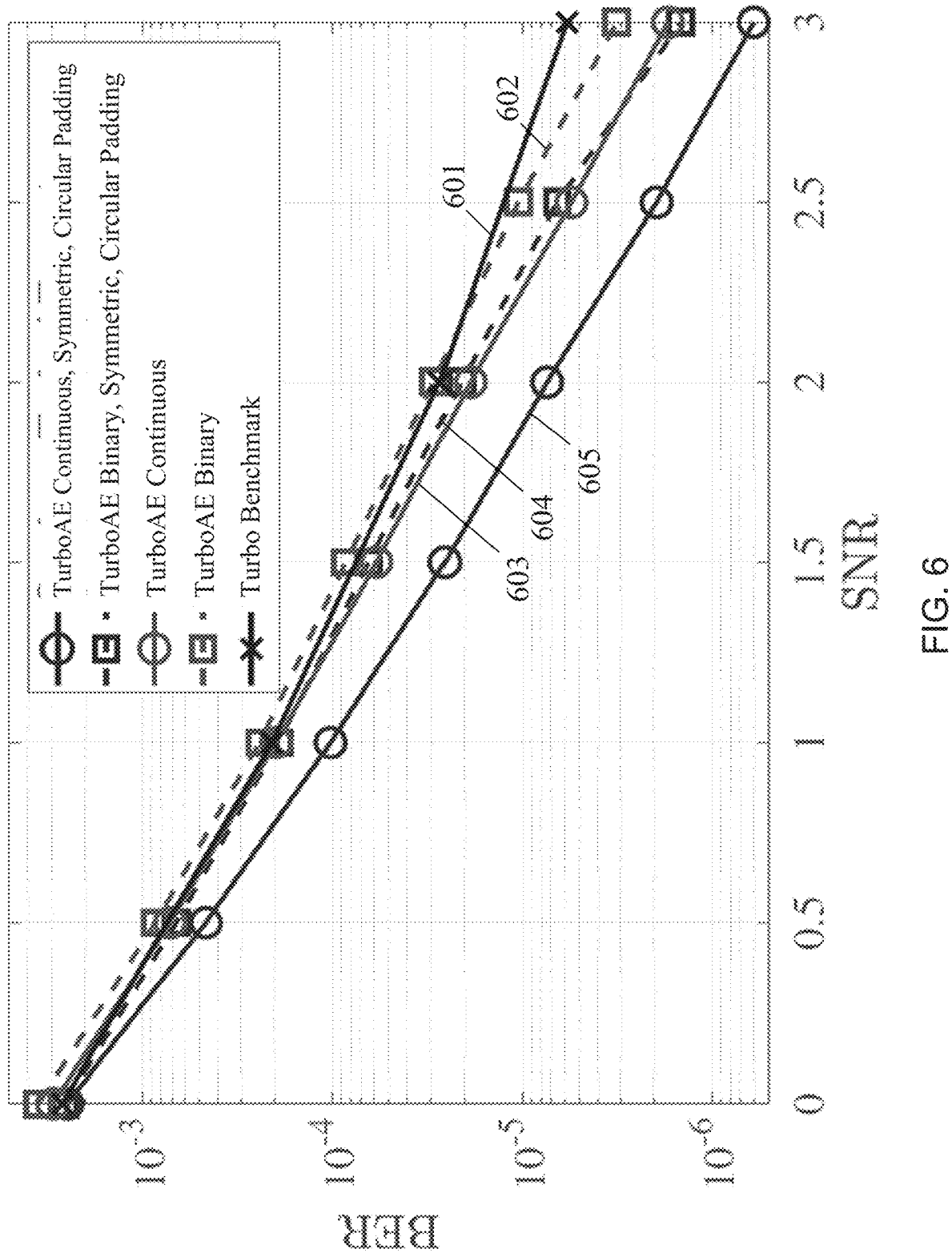
FIG. 6 is a graph showing bit error rate performance as a function of signal-to-noise ratio for TurboAE CNN binary and TurboAE CNN continuous with and without using a symmetric interleaver and circular padding.

FIG. 6 is a graph showing BER performance as a function of SNR for TurboAE CNN binary and TurboAE CNN continuous with and without using a symmetric interleaver and circular padding. TurboAE binary binarizes codes words, whereas TurboAE continuous does not binarize codewords. Curve 601 is a baseline BER performance for classical Turbo Code. Curve 602 is BER performance for TurboAE binary. Curve 603 is BER performance for TurboAE continuous. Curve 604 is BER performance for TurboAE binary using a symmetric interleaver and circular padding. Curve 605 is BER performance with TurboAE continuous using a symmetric interleaver and circular padding.

Figure 7:
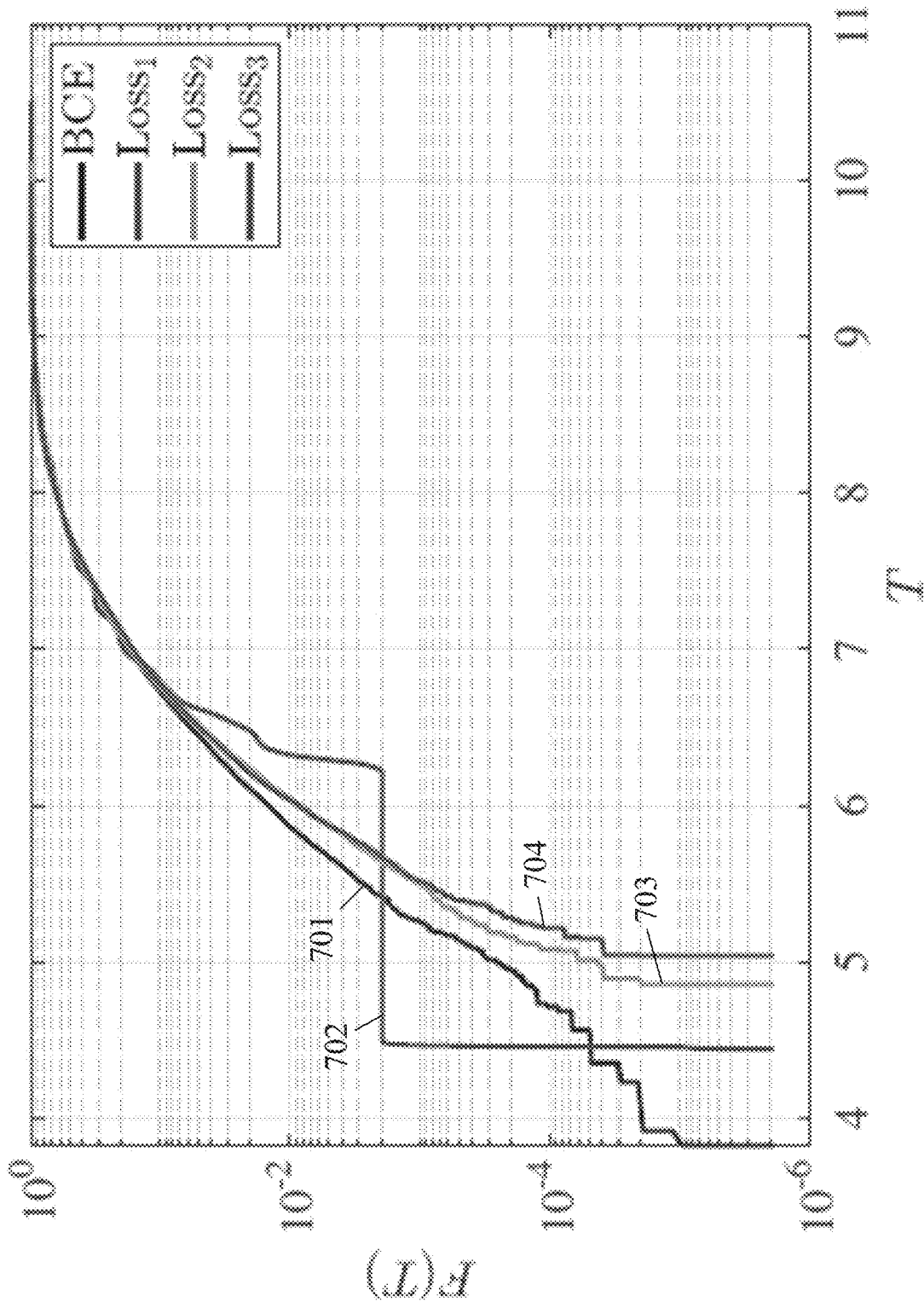
FIG. 7 is a graph shows distance distribution enhancements provided by for TurboAE CNN according to the subject matter disclosed herein.

FIG. 7 is a graph showing distance distribution enhancements provided by Eqs. (13)-(15) for TurboAE CNN. It should be kept in mind that the distance distribution enhances provided by Eqs. (13)-(15) may be used for any channel code based on neural network (i.e., any code channel that involves a training process). As the curves in FIG. 7 are positioned further to the right, the codeword distance distribution is further enhanced. Curve 701 is the BCE for TurboAE. Curve 702 is for $Loss_1$ shown in Eq. (13). Curve 703 is for $Loss_2$ shown in Eq. (14). Curve 704 is for $Loss_3$ shown in Eq. (15), which provides the best pairwise codeword distribution.

Figure 8:
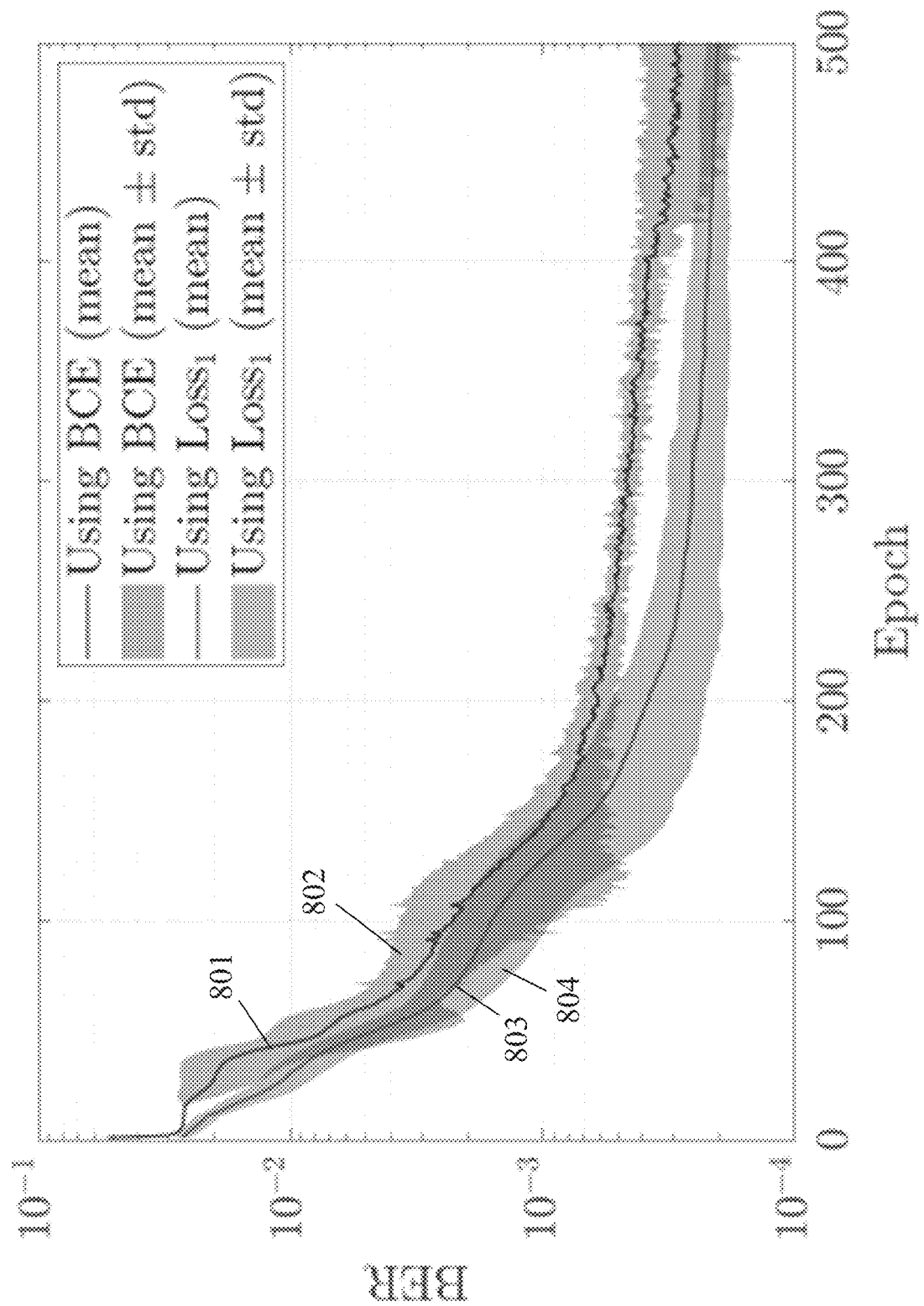
FIG. 8 is a graph showing training trajectories of bit error rate of TurboAE CNN as a function of epoch for the Binary Cross Entropy loss function and the Binary Cross Entropy loss function plus $Loss_1$ disclosed herein.

FIG. 8 is a graph showing training trajectories of BER of TurboAE CNN as a function of epoch for the BCE loss function and the BCE loss function plus $Loss_1$. Curve 801 is the training trajectory of the mean BER for the BCE loss function. The shaded gray area 802 is the training trajectory of the mean±standard deviation of the BER for the BCE loss function. Curve 803 is the training trajectory of the mean BER for the mean BCE loss function plus $Loss_1$. Curve 804 is the training trajectory of the mean±standard deviation of the BER for the BCE loss function plus $Loss_1$.

As the training epoch increases in FIG. 8, the additional training results in a lower BER. Curves 803 and 804 show that time and energy is saved during the training process because fewer epochs are involved for an enhanced codeword distance distribution as compared to curves 801 and 802 for the same BER.

Figure 9:
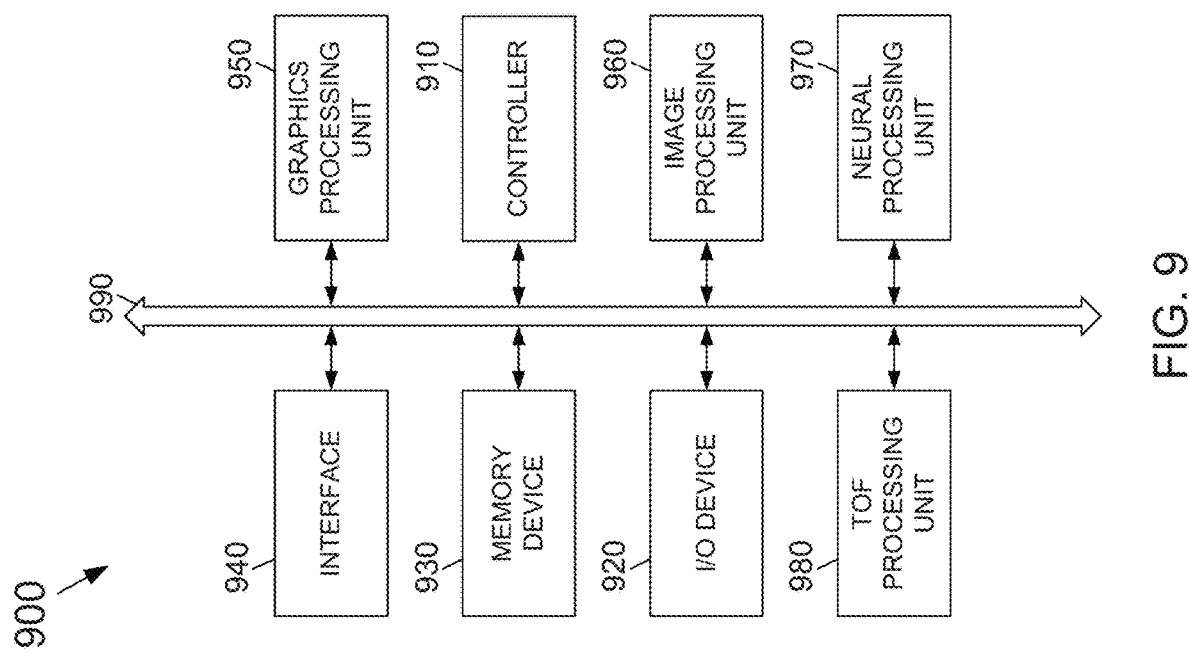
FIG. 9 depicts an electronic device that may include an encoder/decoder system that uses convolutional or recurrent neural network units, includes a symmetric interleaver/de-interleaver, uses circular padding, and/or provides an enhanced the pairwise codeword distance distribution of a channel code according to the subject matter disclosed herein.

FIG. 9 depicts an electronic device 900 that in one embodiment may include an encoder/decoder system that is based on TurboAE that includes a symmetric interleaver/de-interleaver and uses circular padding according to the subject matter disclosed herein. In another embodiment, the electronic device 900 may include an encoder/decoder system that uses convolutional or RNN units and includes a symmetric interleaver/de-interleaver and uses circular padding. In still another embodiment, the electronic device 900 may include a trainable encoder/decoder system that provides an enhanced the pairwise codeword distance distribution of a channel code according to the subject matter disclosed herein.

Electronic device 900 and the various system components of electronic device 900 may be formed from one or more modules. The electronic device 900 may include a controller (or CPU) 910, an input/output device 920 such as, but not limited to, a keypad, a keyboard, a display, a touch-screen display, a 2D image sensor, a 3D image sensor, a memory 930, an interface 940, a GPU 950, an imaging-processing unit 960, a neural processing unit 970, a TOF processing unit 980 that are coupled to each other through a bus 990. In one embodiment, the 2D image sensor, the 3D image sensor and/or the non-contact thermal sensor may be part of the imaging processing unit 960. The controller 910 may include, for example, at least one microprocessor, at least one digital signal processor, at least one microcontroller, or the like. The memory 930 may be configured to store a command code to be used by the controller 910 and/or to store a user data.

The interface 940 may be configured to include a wireless interface that is configured to transmit data to or receive data from, for example, a wireless communication network using a RF signal. In one embodiment, the interface 940 may include an encoder/decoder system that is based on TurboAE that includes a symmetric interleaver/de-interleaver and uses circular padding according to the subject matter disclosed herein. In another embodiment, the interface 940 may include an encoder/decoder system that uses RNN units and includes a symmetric interleaver/de-interleaver and uses circular padding. In still another embodiment, the interface 940 may be based on a trainable encoder/decoder system that provides an enhanced the pairwise codeword distance distribution of a channel code according to the subject matter disclosed herein. The wireless interface 940 may include, for example, an antenna. The electronic system 900 also may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), Fifth-Generation Wireless (5G), Sixth-Generation Wireless (6G), and so forth.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A symmetric interleaver for a Convolutional Neural Network (CNN) or Recurrent Neural Network (RNN) encoder, comprising:
    an input interface configured to receive an input block of K elements;
    an output interface configured to output an output block of K elements; and
    a controller configured to:
        identify a prime relationship in which a parameter $\delta$ and K have 1 as the only common factor;
        interleave, based on the prime relationship, elements of the input block to form the output block in which an output neighborhood of elements for each element of the output block is symmetric to an input neighborhood of elements for each element of the input block;
        generate an encoded block based on the output block; and
        transmit a signal comprising the encoded block, wherein a value of the parameter $\delta$ is greater than a convolutional filter size, and an interleaving position of the input block is determined partially based on the parameter $\delta$ and the parameter K.

2. The symmetric interleaver of claim 1, wherein the controller is further configured to interleave a position of an element of the input block based on an index i of the position times the parameter $\delta$ modulo K to avoid an interleaving of position i equaling an interleaving of a position j of an element of the output block for i not equaling j.

3. The symmetric interleaver of claim 2, wherein the value of the parameter $\delta$ is greater than or equal to the convolutional filter size w and less than or equal to a floor value of a quantity K minus w divided by a quantity w minus 1.

4. The symmetric interleaver of claim 3, further comprising a CNN or RNN decoder.

5. The symmetric interleaver of claim 4, wherein the CNN or RNN encoder comprises part of a Turbo Autoencoder (TurboAE) encoder, and the CNN or RNN decoder comprises part of a TurboAE decoder.

6. The symmetric interleaver of claim 2, further comprising a circular padding mode that adds a predetermined number of elements to beginning of the input block and the predetermined number of elements to an end of the input block, interleaves the input block to form an intermediate block, and removes the predetermined number of elements from a beginning and the predetermined number of elements from an end of the intermediate block to form the output block.

7. The symmetric interleaver of claim 6, wherein K equals 100 elements, and
    wherein a positional bit error rate (BER) of elements of the output block is less than $1 \times 10$ 3.9 for all bit positions of the output block.

8. The symmetric interleaver of claim 1, wherein the CNN or RNN encoder comprises part of a Turbo Autoencoder (TurboAE) encoder.

9. The symmetric interleaver of claim 8, wherein a test loss function for training the TurboAE encoder comprises a Binary Cross Entropy (BCE) loss function of the TurboAE encoder plus a function that minimizes a number of codeword pairs with Euclidean distance that is at most T.

10. The symmetric interleaver of claim 9, wherein the function includes a Sigmoid function or a Rectified Linear Unit (ReLu) function.

* * * * *